United States Patent
Lee

(10) Patent No.: US 7,961,537 B2
(45) Date of Patent: Jun. 14, 2011

(54) SEMICONDUCTOR INTEGRATED CIRCUIT

(75) Inventor: Hyung-Dong Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/829,994

(22) Filed: Jul. 2, 2010

(65) Prior Publication Data

US 2010/0264945 A1 Oct. 21, 2010

Related U.S. Application Data

(62) Division of application No. 12/018,732, filed on Jan. 23, 2008, now abandoned.

(30) Foreign Application Priority Data

Aug. 14, 2007 (KR) .................. 10-2007-0081555

(51) Int. Cl.
G11C 7/00 (2006.01)
(52) U.S. Cl. .................. 365/201; 365/185.21
(58) Field of Classification Search ............ 365/201
See application file for complete search history.

(56) References Cited

U.S. PATENT DOCUMENTS

| 5,966,337 | A | 10/1999 | Lee et al. |
| 6,043,685 | A | 3/2000 | Lee |
| 6,097,653 | A | 8/2000 | Park |
| 6,347,058 | B1 | 2/2002 | Houghton et al. |
| 7,002,862 | B2 | 2/2006 | Kang |
| 7,633,818 | B2 * | 12/2009 | Tomita .................. 365/201 |
| 2003/0206462 | A1 | 11/2003 | McClure |
| 2005/0068816 | A1 * | 3/2005 | Yoshimatsu et al. ........ 365/201 |
| 2006/0013030 | A1 * | 1/2006 | Arimoto et al. ............. 365/63 |
| 2006/0111865 | A1 | 5/2006 | Choi |

FOREIGN PATENT DOCUMENTS

| JP | 10340583 | 12/1998 |
| JP | 2002230978 | 8/2002 |
| KR | 1019970017697 | 4/1997 |
| KR | 1020000026171 | 5/2000 |
| KR | 1020010090171 | 10/2001 |
| KR | 1020030074129 | 9/2003 |

* cited by examiner

*Primary Examiner* — Amir Zarabian
*Assistant Examiner* — Anthan T Tran
(74) *Attorney, Agent, or Firm* — Baker & McKenzie LLP

(57) ABSTRACT

A semiconductor integrated circuit includes a sense amplifier for sensing input data and a sense amplifier controller for blocking a signal path between the sense amplifier and a memory cell when a test mode signal is activated.

11 Claims, 7 Drawing Sheets

SEMICONDUCTOR INTEGRATED CIRCUIT

CROSS-REFERENCES TO RELATED APPLICATION

This is a divisional application of application Ser. No. 12/018,732, filed Jan. 23, 2008, titled "Semiconductor Integrated Circuit," which is incorporated herein by reference in its entirety as if set forth in full, and which claims priority under 35 U.S.C. 119(a) to Korean application number 10-2007-0081555, filed on Aug. 14, 2007, which is incorporated by reference in its entirety as if set forth in full.

BACKGROUND

1. Technical Field

The embodiments described herein relate to a semiconductor integrated circuit and, more particularly, to a semiconductor integrated circuit capable of executing an I/O test of data.

2. Related Art

In conventional systems, interface circuits are provided between a semiconductor integrated circuit and a controller for controlling the semiconductor integrated circuit. Often, however, there is a skew between the interfaces between the semiconductor integrated circuit and the controller. If the skew exceeds a predetermined range, then data transmission error can occur.

Accordingly, a data transmission test has to be performed in order to confirm whether data transmission is carried out normally by a particular semiconductor integrated circuit. The data transmission test is carried out in such a manner that a specific data pattern is communicated between the semiconductor integrated circuit and the controller.

For the execution of the data transmission test, a conventional semiconductor integrated circuit uses memory cells which are provided for normal data storage in the vicinity of the I/O circuit or uses additional memory cells, which are different from those configured for normal data storage. Using additional memory cells provided in the I/O circuit requires additional area and creates complicated timing control and metal wires. Furthermore, using memory cells configured for normal data storage can cause excessive current consumption in activating word lines and sensing data of bit lines. This excessive current consumption can cause noise and errors in the data transmission test.

SUMMARY

A semiconductor integrated circuit capable of reducing a circuit area for a data transmission test is described herein. Further, a test method that does not require timing control for a data transmission test Is also described as well as methods for minimizing current consumption and a noise in a data transmission test.

According to one aspect, a semiconductor integrated circuit comprises a sense amplifier for sensing input data, and a sense amplifier controller for blocking a signal path between the sense amplifier and a memory cell when a test mode signal is activated.

According to another aspect, a semiconductor integrated circuit comprises a sense amplifier for sensing and amplifying input data, a sense amplifier controller for blocking a column path between the sense amplifier and a memory cell in response to a selection blocking signal, and an array controller for deactivating a selection signal to select a row path between a row decoder and the memory cell and for activating the selection blocking signal in response to a test mode signal.

According to still another aspect, a semiconductor integrated circuit comprised a memory cell, a signal path between a data input terminal and the memory cell, wherein the signal path including a plurality of circuit blocks, and a control block which blocks the signal path between any one of the plurality of circuit blocks to the memory cell, and storing data from the data input terminal to the any one of the plurality of circuit blocks, when the control block recognizes a test command.

According to still another aspect, a circuit area for testing a data transmission can be reduced without an addition of separate memory cells by storing test data in a storage element on a column signal path.

According to still another aspect, since an input/output of test data is conducted in such a manner that an input/output of normal data is conducted on a normal column signal path, there is no additional timing control and the circuit is then implemented by a simple configuration. Further, since a word line is not activated during a data transmission, a current consumption is minimized and noise can be prevented by the minimized current consumption.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
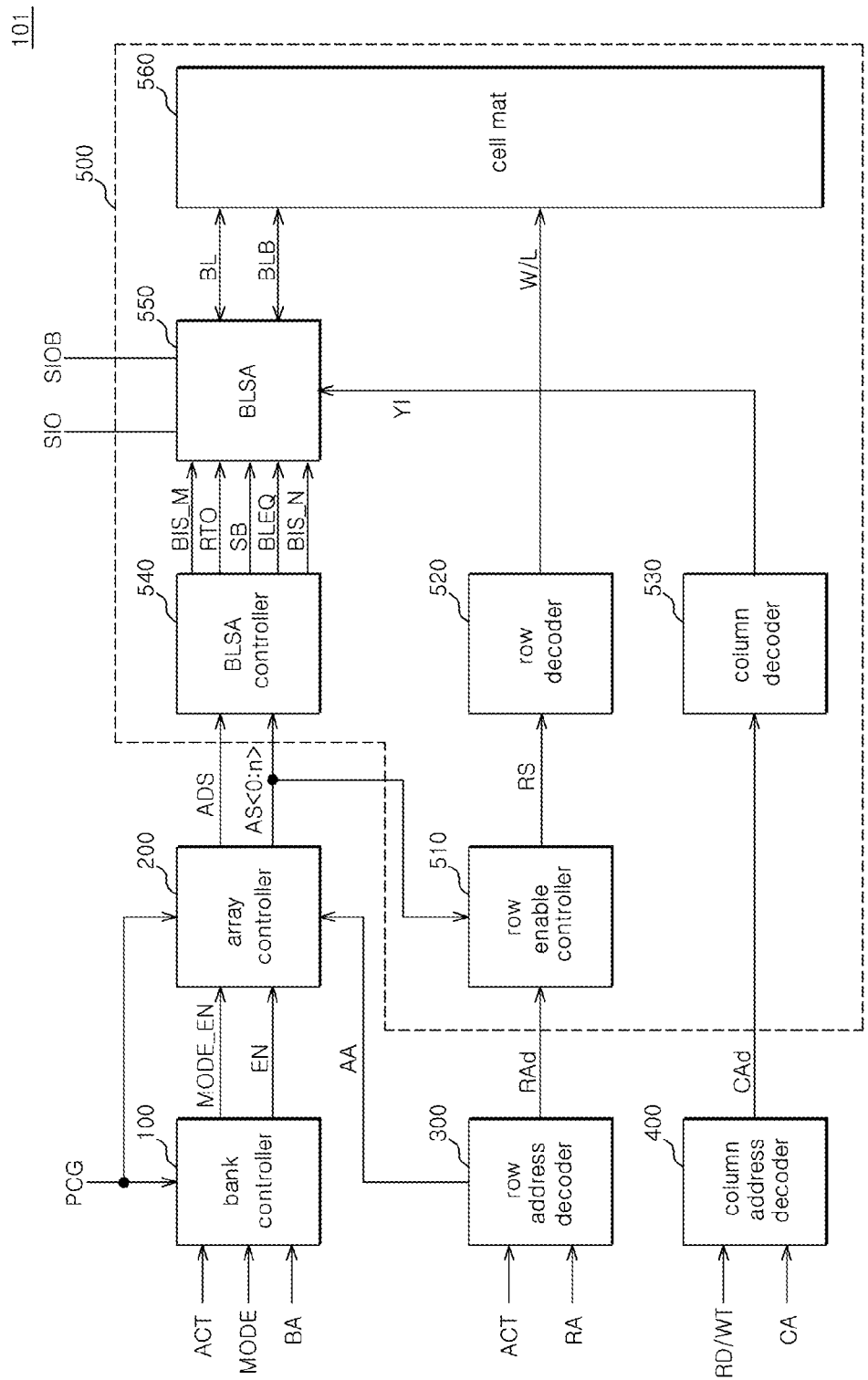
FIG. 1 is a block diagram illustrating a semiconductor integrated circuit according to one embodiment.

FIG. 1 is a diagram illustrating an example semiconductor integrated circuit 101 configured in accordance with one embodiment. As shown in FIG. 1, the semiconductor integrated circuit 101 can include a bank controller 100, an array controller 200, a row address decoder 300, a column address decoder 400 and a memory bank 500.

The memory bank 500 can include a row enable controller 510, a row decoder 520, a column decoder 530, a bit line sense amplifier controller (hereinafter, referred to as "BLSA controller") 540, a bit line sense amplifier (hereinafter, referred to as "BLSA") 550 and a cell mat 560.

The bank controller 100 can be configured to receive an active command 'ACT', a test command 'MODE' and bank address signals 'BA' and to output an enable signal 'EN' and a test mode enable signal "MODE_EN". The array controller 200 can be configured to receive the enable signal 'EN', the test mode enable signal "MODE_EN" and array address signals 'AA' and to output an array selection signal 'AS' and an array selection blocking signal 'ADS'.

The row address decoder 300 can be configured to decode row address signals 'RA' from an external circuit in response to the active command 'ACT' and then output internal row address signals 'RAd', which are used in the semiconductor integrated circuit 101. The column address decoder 400 can be configured to decode column address signals 'CA' from an external circuit in response to the read/write command 'ACT' and then outputs internal column address signals 'CAd', which are used in the semiconductor integrated circuit.

The row enable controller 510 can be configured to receive the internal row address signals 'RAd' and the array selection signal 'AS' and output a row selection signal 'RS'. The row decoder 520 can be configured to receive the row selection signal 'RS' and activate a word line W/L, which corresponds to the row selection signal 'RS'. The column decoder 530 can be configured to receive the internal column address signals 'CAd' and output a column selection signal 'YI'.

The BLSA controller 540 can be configured to receive the array selection signal 'AS' and the array selection blocking signal 'ADS' and output bit line isolation signals 'BIS_M' and 'BIS_N', driving voltage signals 'RTO' and 'SB', and a bit line equalizing signal 'BLEQ'.

The BLSA 550 can be configured to couple a pair of I/O lines SIO and SIOB to a pair of the bit lines BL and BLB. The BLSA 550 can also be configured to receive the bit line isolation signals 'BIS_M' and 'BIS_N', the driving voltage signals 'RTO' and 'SB', the bit line equalizing signal 'BLEQ', and the column selection signal 'YI'. The BLSA 550 can be configured to sense and amplify data loaded on the I/O lines SIO and SIOB or the bit lines BL and BLB in response to the bit line isolation signals 'BIS_M' and 'BIS_N' or the column selection signal 'YI'. The BLSA 550 can also be configured to output the sense-amplified data through the I/O lines SIO and SIOB or the bit lines BL and BLB.

The semiconductor integrated circuit 101 can use the BLSA itself as a storage medium for the test instead of forming an additional memory cell.

In order to increase the efficiency of the data I/O control, for example, the semiconductor integrated circuit 101 can be configured to classify the entire memory cell area into a plurality of cell areas and have a plurality of the data I/O circuits that correspond to the classified areas. For example, the entire memory cell area can be divided into a plurality of memory banks and each of the plurality of memory banks can be divided into a plurality of cell mats as shown in FIG. 2.

Figure 2:
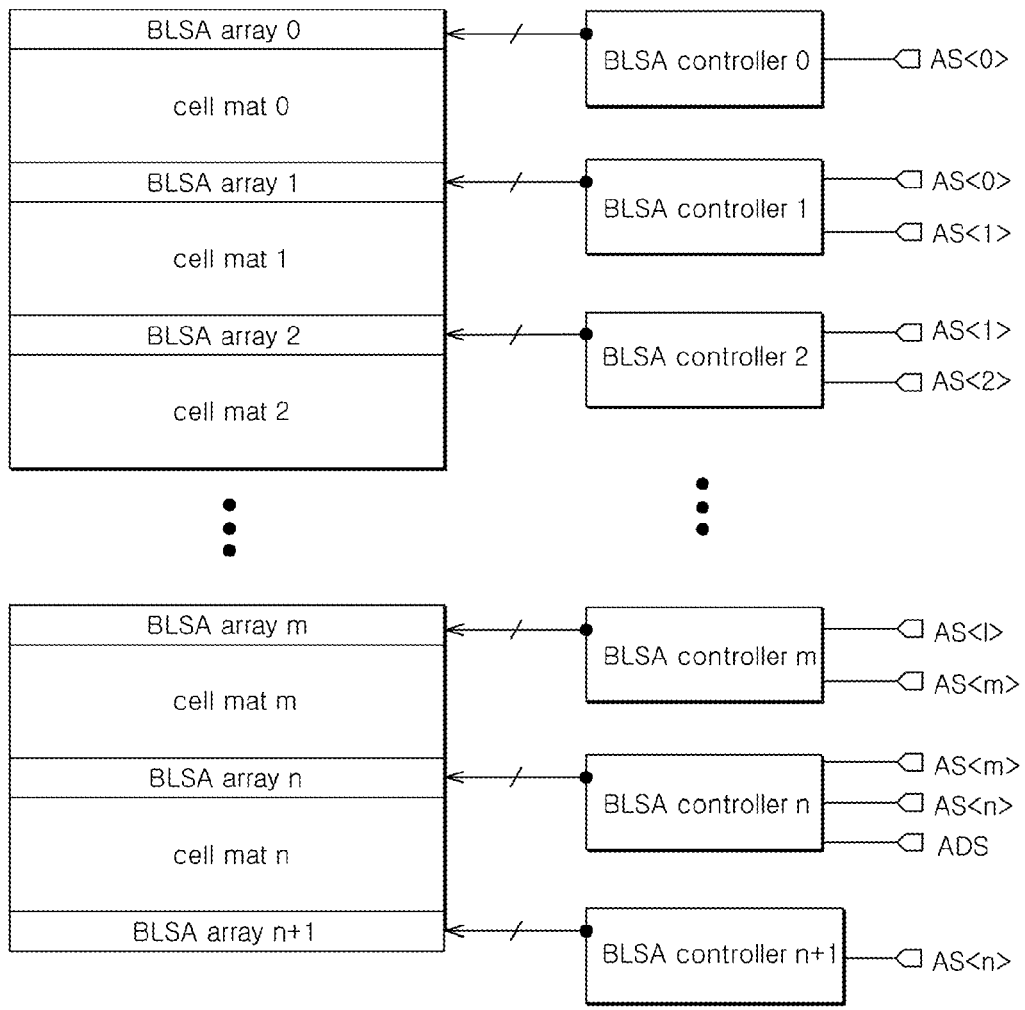
FIG. 2 is a block diagram illustrating an example in which the semiconductor integrated circuit of FIG. 1 is employed.

Referring to FIG. 2, a plurality of BLSA arrays (BLSA array 0 to BLSA array n+1) can be provided to sense and amplify the data in the plurality of cell mats (cell mat 0 to cell mat n). The plurality of BLSA arrays (BLSA array 0 to BLSA array n+1) can include a plurality of BLSAs. depending on the embodiment, the plurality of BLSA arrays can be selectively used for the test. FIG. 2 shows an example where BLSA array n is used for the test. Even if all the BLSA arrays (BLSA array 0 to BLSA array n+1) can be used for the test, just one of them with the high capacity can be used for the test as compared with the additional memory cell, which has been used in the conventional test.

Figure 3:
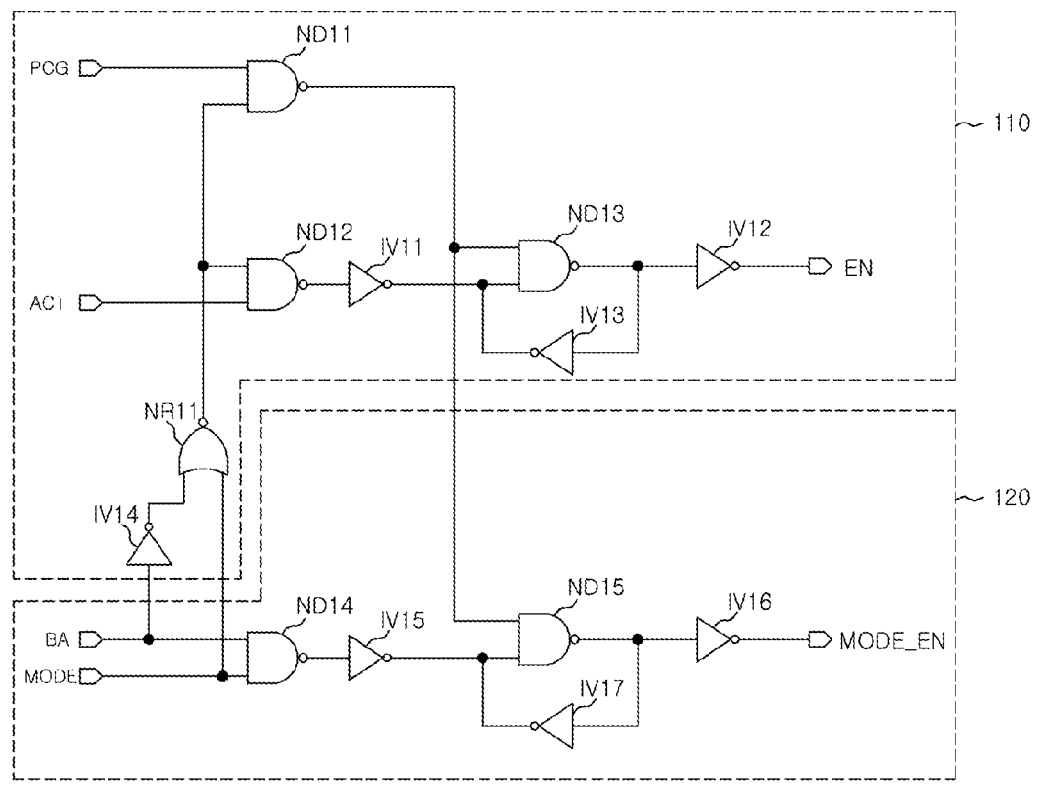
FIG. 3 is a circuit diagram illustrating a bank controller that can be included in the circuit illustrated in FIG. 1.

As shown in FIG. 3, the bank controller 100 can include an enable signal generating unit 110 and a test mode enable signal generating unit 120. The enable signal generation unit 110 can be configured to generate the enable signal 'EN' by using the bank address signals 'BA', the test command 'MODE', the active command 'ACT', and a precharge signal 'PCG'. The enable signal generation unit 110 can include first to third NAND gates ND11 to ND13, a first NOR gate NR11, and first to fourth inverters IV11 to IV14. In a state where the bank address signals 'BA' are activated and the test command 'MODE' is deactivated, the enable signal generation unit can be configured to activate the enable signal 'EN' when the active command 'ACT' is activated. The enable signal generation unit 110 can be configured to deactivate the enable signal 'EN' when the bank address signals 'BA' are deactivated, the test command 'MODE' is activated, or the precharge signal 'PCG' is activated.

The test mode enable signal generating unit 120 can be configured to generate the test mode enable signal "MODE_EN" by using the bank address signals 'BA', the test command 'MODE', and the precharge signal 'PCG'. The test mode enable signal generating unit 120 can include fourth and fifth NAND gates ND14 and ND15 and fifth to seventh inverters IV15 to IV17. The test mode enable signal generating unit 120 can be configured to activate the test mode enable signal "MODE_EN" when the bank address signals 'BA' and the test command 'MODE' are activated. The test mode enable signal generating unit 120 can be configured to deactivate the test mode enable signal "MODE_EN" when the bank address signals 'BA' are deactivated, the test command 'MODE' is deactivated, or the precharge signal 'PCG' is activated.

Figure 4:
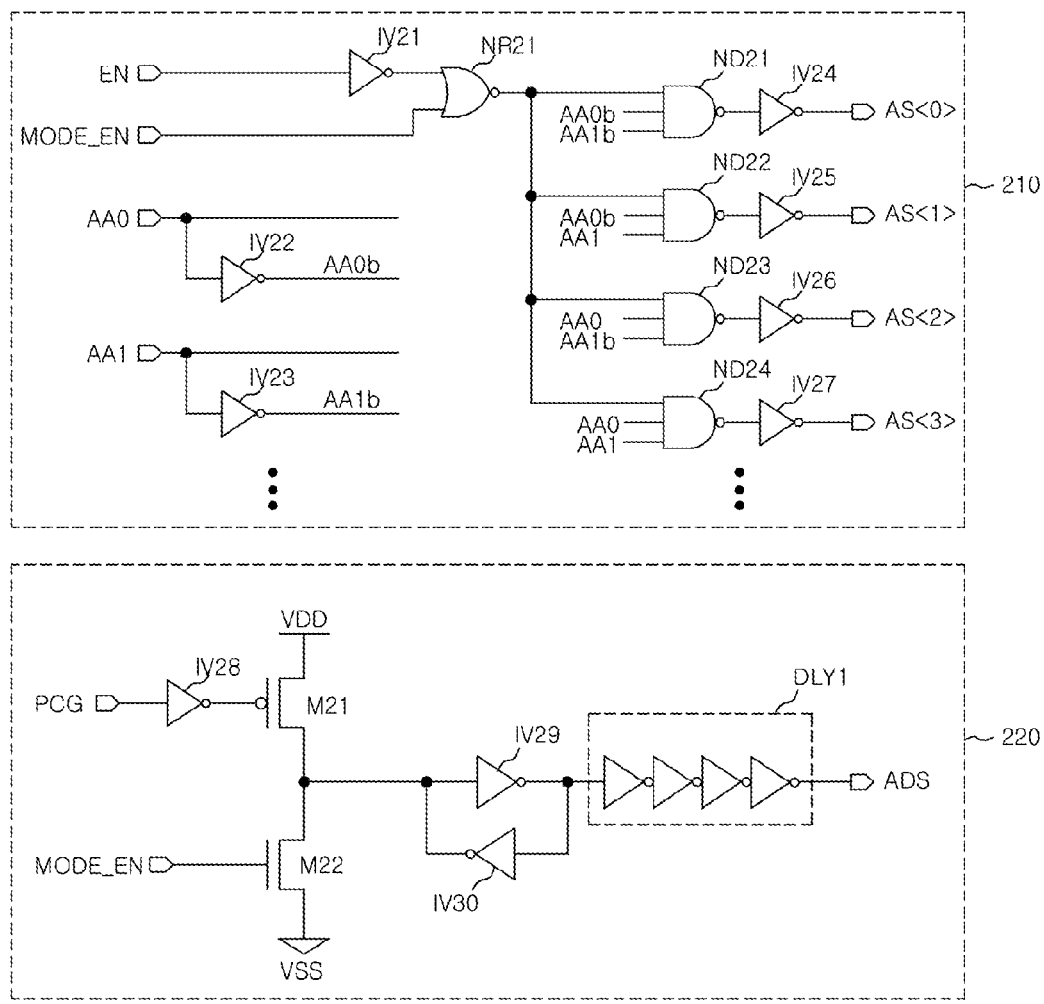
FIG. 4 is a circuit diagram illustrating an array controller that can be included in the circuit illustrated in FIG. 1.

As shown in FIG. 4, the array controller 200 can provide an array selection signal generating unit 210 and an array selection blocking signal generating unit 220. The array selection signal generator 210 can be configured to decode array address signals 'AA' and generate array selection signals 'AS' according to the combination results of the enable signal 'EN' and the test mode enable signal "MODE_EN". The array selection signal generating unit 210 can include first to seventh inverters IV21 to IV27, the first NOR gate NR21, and first to fourth NAND gates ND21 to ND24. The array selection signal generating unit 210 can be configured to decode the array address signals 'AA' and generate the array selection signals 'AS' when the enable signal 'EN' is activated and the test mode enable signal "MODE_EN" is deactivated.

In FIG. 4, the array selection signal generating unit 210 is exemplarily illustrated based on the two-bit array address signals 'AA'0 and 'AA'1. It will be understood that with an increase in the number of address bits, the array selection signals 'AS'<0:n> can also be increased.

The array selection blocking signal generating unit 220 can be configured to generate the array selection blocking signal 'ADS' according to the test mode enable signal "MODE_EN" and the precharge signal 'PCG'. The array selection blocking signal generating unit 220 can include eighth to tenth inverters IV28 to IV30, first and second transistors M21 and M22, and a delay unit DLY1. The array selection blocking signal generating unit 220 can be configured to activate the array selection blocking signal 'ADS' when the test mode enable signal "MODE_EN" is activated.

Figure 5:
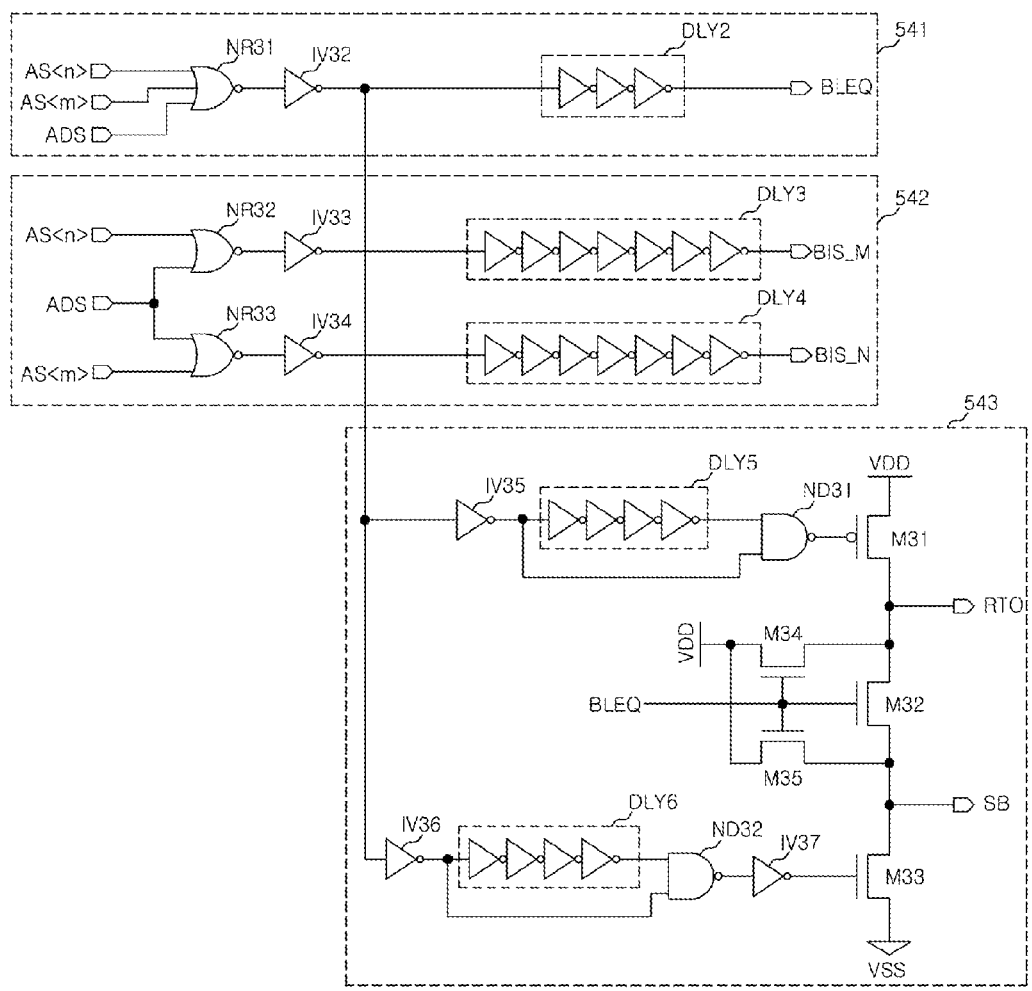
FIG. 5 is a circuit diagram illustrating a sense amplifier controller in FIG. 1.

As shown in FIG. 5, the BLSA controller 540 includes a bit line equalization signal generating unit 541, a bit line isolation signal generating unit 542, and a power supply unit 543. The bit line equalization signal generating unit 541 can be configured to generate a bit line equalization signal 'BLEQ' according to the array selection signal 'AS'<m> and 'AS'<n>. The array selection blocking signal 'ADS' can be used to decide the selection of the two cell mats (cell mats m and n) (FIG. 2), which are coupled to the BLSA array n. The bit line equalization signal generating unit 541 can include a first NOR gate NR31, a first inverter IV31, and a first delay unit DLY2. The bit line equalization signal generating unit 541 can, e.g., also be configured to activate the bit line equalization signal 'BLEQ' when all of the array selection signals 'AS'<m> and 'AS'<n> and the array selection blocking signal 'ADS' are deactivated.

The bit line isolation signal generating unit 542 can be configured to generate the bit line isolation signals 'BIS_M' and 'BIS_N' according to the result of the logical summation of the array selection blocking signal 'ADS' and the array selection signals 'AS'<m> and 'AS'<n>. The bit line isolation signal generating unit 542 can include second and third NOR gates NR32 and NR33, second and third inverters IV33 and IV34, a second delay unit DLY3 and a third delay unit DLY4. The bit line isolation signal generating unit 542 can be configured to deactivate all of the bit line isolation signals 'BIS_M' and 'BIS_N' when the array selection blocking signal 'ADS' is activated.

Referring again to FIG. 2, when the array selection signal 'AS'<n> is activated, the bit line isolation signal generating unit 542 can deactivate the bit line isolation signal 'BIS_M' in order to block a connection between the BLSA 550 and the cell mat m. Also, when the array selection signal 'AS'<m> is activated, the bit line isolation signal generating unit 542 can be configured to deactivate the bit line isolation signal 'BIS_N' in order to block the connection of the cell mat n and the BLSA 550.

According to the result of the logical summation of the array selection signals 'AS'<m> and 'AS'<n> and the array selection blocking signal 'ADS', the power supply unit 543 can be configured to apply the operating voltages 'RTO' and 'SB' to the BLSA 550. The power supply unit 543 can include fourth to sixth inverters IV35 to IV37, fourth and fifth delay units DLY5 and DLY6, the first and second NAND gates ND31 and ND32, and first to fifth transistors M31 to M35. The first to third transistors M31 to M33 can be connected between an external power supply (VDD) and a ground voltage source (VSS). The operating voltage signal 'RTO' is output through a node at which the first transistor M31 is connected to the second transistor M32 and the operating voltage signal 'SB' is output through a node at which the second transistor M32 is connected to the third transistor M33.

The fourth transistor M34 can have a drain configured to receive the external power supply (VDD) and a source configured to receive the operating voltage 'RTO'. The fifth transistor M35 can also have a drain configured to receive the external power supply (VDD) and a source configured to receive the operating voltage 'SB'. The bit line equalization signal 'BLEQ' can be commonly applied to the gates of the second, fourth and fifth transistors M32, M34 and M35.

The fourth inverter IV35 can be configured to receive an output of the first inverter IV32 in the bit line equalization signal generating unit 541. The fourth delay unit DLY5 can be configured to receive an output of the fourth inverter IV35, and the first NAND gate ND31 can be configured to receive an output of the fourth delay unit DLY5 and the output of the fourth inverter IV35. The output terminal of the first NAND gate ND31 can be connected to a gate of the first transistor M31.

The fifth inverter IV36 can be configured to receive the output of the first inverter IV32 in the bit line equalization signal generating unit 541 and the fifth delay unit DLY6 can be configured to receive an output of the fifth inverter IV36. The second NAND gate ND32 can be configured to receive an output of the fifth delay unit DLY6 and the output of the fifth inverter IV36. The sixth inverter IV37 can be configured to receive an output of the second NAND gate ND32 and an output terminal of the sixth inverter IV37 can be connected to a gate of the third transistor M33.

Figure 6:
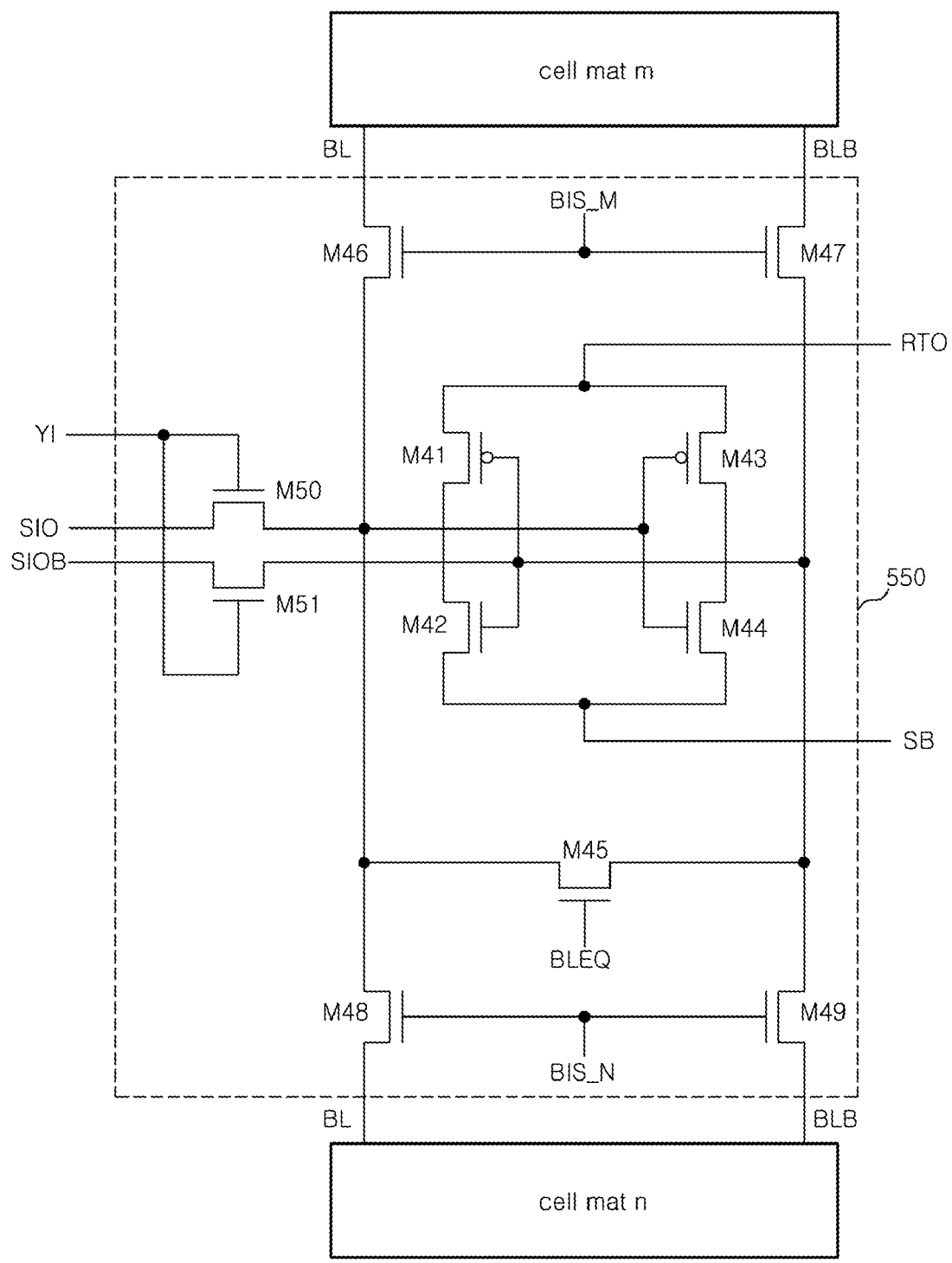
FIG. 6 is a circuit diagram illustrating a sense amplifier that can be included in the circuit illustrated in FIG. 1.

As shown in FIG. 6, the BLSA 550 can be connected to the cell mats m and n through the bit line pair BL and BLB and can include a cross-coupled latch circuit having first to eleventh transistors M41 to M51. The operating voltage signal 'RTO' can be commonly applied to sources of the first and third transistors M41 and M43 and the operating voltage 'SB' can also be applied to sources of the second and fourth transistors M42 and M44. The fifth transistor M45 can have a gate to which the bit line equalization signal 'BLEQ' is applied and a source and a drain, which are respectively connected to the bit lines BL and BLB. The sixth and seventh transistors M46 and M47, which are respectively disposed in the bit lines BL and BLB connected to the cell mat m, can have gates to which the bit line isolation signal 'BIS_M' is commonly applied. The eighth and ninth transistors M48 and M49, which are also respectively disposed in the bit lines BL and BLB connected to the cell mat m, can have gates to which the bit line isolation signal 'BIS_N' is commonly applied.

The tenth transistor M50 can have a source that is commonly connected to the bit line BL and the gates of the third and fourth transistors M43 and M44 and a drain that is connected to the I/O line SIO. The eleventh transistor M51 can have a source that is commonly connected to the bit line BL and the gates of the first and second transistors M41 and M42, and a drain that is connected to the I/O line SIOB. The column selection signal 'YI' can be commonly applied to gates of the tenth and eleventh transistors M50 and M51.

The operation of the semiconductor integrated circuit 101 will now be described in detail referring to FIGS. 1 to 7.

First, the operation will be described in the test mode. In an external system such as a GPU (Graphic Processing Unit), the test command 'MODE', the bank address signals 'BA' and the row and column address signals 'RA' and 'CA' can be activated in order to execute the I/O test for the semiconductor integrated circuit 101. Referring to FIG. 1, the row address decoder 300 can decode the row address signals 'RA' and output the internal row address signals 'RAd' and the array address signals 'AA' and the column address decoder 400 can decode the column address signals 'CA' and output the internal column address signals 'CAd'. The column decoder 530 can decode the internal column address 'CAd' and activate the column selection signal 'YI'.

In the enable signal generation unit 110 in the bank controller 100 of FIG. 3, the NOR gate NR11 can output a low level signal because the test command 'MODE' is activated. Also, the first inverter IV11 outputs a low level signal according to the low level signal of the NOR gate NR11 and then deactivates the enable signal 'EN'.

In the test mode enable signal generating unit 120 in the bank controller 100, the fifth inverter IV15 can output a high level signal because the test command 'MODE' and the bank address signals 'BA' are activated. Since the NOR gate NR11 outputs the low level signal and the precharge command 'PCG' is deactivated to a low level, the first NAND gate ND11 outputs a high level signal. Also, since the first NAND gate ND11 outputs a high level signal and the fifth inverter IV15 outputs the high level signal, the fifth NAND gate ND15 outputs a low level signal. The sixth inverter IV16 activates the test mode enable signal "MODE_EN' to a high level because the fifth NAND gate ND15 outputs the low level signal.

The array selection signal generator 210 in the array controller 200 of FIG. 4 deactivates all the array selection signals 'AS'<0>, 'AS'<1>, . . . , 'AS'<m> and 'AS'<n> because the test mode enable signal "MODE_EN' is at a high level. The array selection blocking signal generating unit 220 in the array controller 200 activates the array selection blocking signal 'ADS' to a high level because the test mode enable signal "MODE_EN' is at a high level.

The row enable controller 510 of FIG. 1 deactivates the row selection signal 'RS' because the array selection signals 'AS'<0>, 'AS'<1>, . . . , 'AS'<m> and 'AS'<n> are deactivated. The row decoder 520 of FIG. 1 deactivates the word line W/L because the row selection signal 'RS' is deactivated. The bit line equalization signal generating unit 541 in the BLSA controller 540 of FIG. 5 deactivates the bit line equalization signal 'BLEQ' because the array selection blocking signal 'ADS' is activated.

The bit line isolation signal generating unit 542 in the BLSA controller 540 deactivates all the bit line isolation signals 'BIS_M' and 'BIS_N' because the array selection blocking signal 'ADS' is activated.

Figure 7:
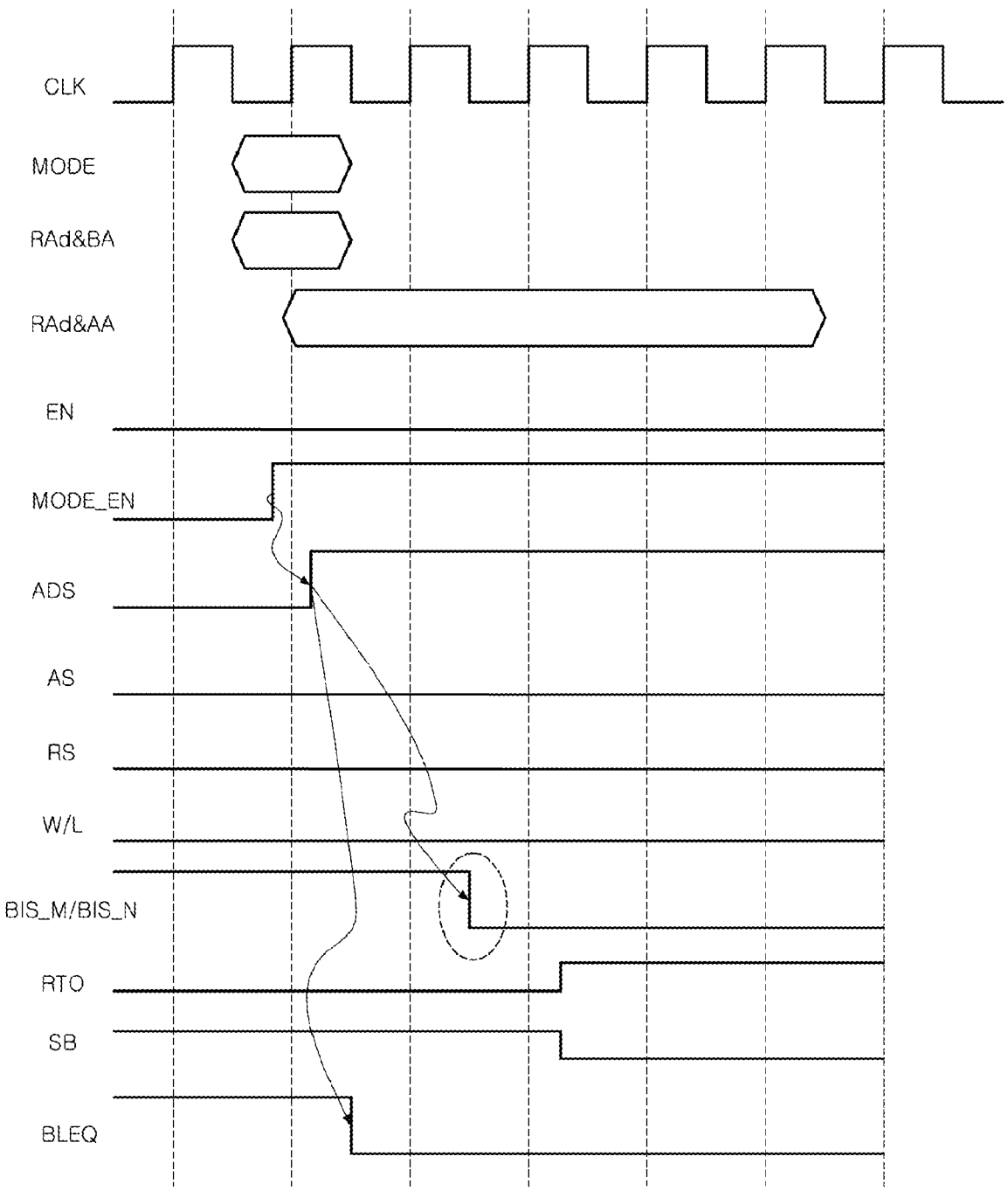
FIG. 7 is a timing chart illustrating the operation of the semiconductor integrated circuit illustrated in FIG. 1.

When the bit line equalization signal 'BLEQ' is activated, the power supply unit makes the operating voltage signal 'RTO' and the operating voltage signal 'SB' be at the same level, e.g., at the level of the external power supply level (VDD), by connecting the terminals of the operating voltage signal 'RTO' and the operating voltage signal 'SB'. If the bit line equalization signal 'BLEQ' is deactivated, then the power supply unit 543 drives the operating voltage signal 'RTO' to the voltage level of the external power supply (VDD) and also drives the operating voltage signal 'SB' to the voltage level of the ground voltage source (VSS) as shown in FIG. 7.

In the BLSA 550 of FIG. 6, the cell mat m and the cell mat n are not electrically coupled to the cross-coupled latch because both the bit line equalization signal 'BLEQ' and bit line isolation signals 'BIS_M' and 'BIS_N' are deactivated. Since the column selection signal 'YI' is activated in a state where both the bit line equalization signal 'BLEQ' and the bit line isolation signals 'BIS_M' and 'BIS_N' are deactivated, the BLSA 550 senses and amplifies the data from exterior of the semiconductor integrated circuit 101 through the I/O lines SIO and SIOB and then stores them. As described above, since the BLSA 550 having cross coupled latch, can store the data. The data stored in the BLSA 550 is thereafter output to the GPU according to the output command from the GPU.

Normal operation of semiconductor integrated circuit 101 will now be described. First, in order to input the normal data, e.g., the GPU activates the bank address signals 'BA', the row address signals 'RA', and the column address signals 'CA' and deactivates the test command 'MODE'.

The row address decoder 300 of FIG. 1 decodes the row address signals 'RA' and outputs the internal low address signals 'RAd' and the array address signals 'AA'. The column address decoder 400 of FIG. 1 decodes the column address signals 'CA' and outputs the internal column address signals 'CAd'. Also, the column decoder 530 of FIG. 1 decodes the internal column address signals 'CAd' and activates the column selection signal 'YI'.

In the enable signal generation unit 110 in the bank controller 100 of FIG. 3, the NOR gate NR11 outputs a high level signal because the test command 'MODE' is deactivated. Also, the first inverter IV11 outputs a high level signal according to the high signal of the NOR gate NR11 and then activates the enable signal 'EN'. In the test mode enable signal generating unit 120 of the bank controller 100, the fifth inverter IV15 outputs a low level signal because the test command 'MODE' is deactivated and the bank address signals 'BA' are activated. Since the NOR gate NR11 outputs the high level signal and the precharge command 'PCG' is deactivated to a low level, the first NAND gate ND11 outputs a high level signal. Although the first NAND gate ND11 outputs a high level signal, the fifth NAND gate ND15 outputs a low level signal because the fifth inverter IV15 outputs the low level signal. The sixth inverter IV16 deactivates the test mode enable signal "MODE_EN" to a low level because the fifth NAND gate ND15 outputs a high level signal.

The array selection signal generator 210 in the array controller 200 of FIG. 4 activates one of the array selection signals 'AS'<0>, 'AS'<1>, . . . , 'AS'<m> and 'AS'<n> because the enable signal 'EN' is in a high level and the test mode enable signal "MODE_EN' is in a low level. The array selection blocking signal generating unit 220 in the array controller 200 maintains the array selection blocking signal 'ADS' in a low level because the test mode enable signal "MODE_EN' is in the low level. The array selection blocking signal 'ADS' is kept in a reset state by the previously issued precharge command 'PCG'.

The row enable controller 510 of FIG. 1 activates the row selection signal 'RS' because one of the array selection signals 'AS'<0>, 'AS'<1>, . . . , 'AS'<m> and 'AS'<n> is activated. The row decoder 520 of FIG. 1 activates the word line W/L connected to oneself because the row selection signal 'RS' is activated. The bit line equalization signal generating unit 541 in the BLSA controller 540 of FIG. 5 deactivates the bit line equalization signal 'BLEQ' because the array selection blocking signal 'ADS' is deactivated and one of the array selection signals 'AS'<m> and 'AS'<n> is activated.

The bit line isolation signal generating unit 542 of the BLSA controller 540 deactivates one of the bit line isolation signals 'BIS_M' and 'BIS_N' because the array selection blocking signal 'ADS' is deactivated and one of the array selection signals 'AS'<m> and 'AS'<n> is activated. For example, the bit line isolation signal 'BIS_M' is deactivated if the array selection signal 'AS'<n> is activated.

When the bit line equalization signal 'BLEQ' is activated, the power supply unit makes the operating voltage signal 'RTO' and the operating voltage signal 'SB' have the same level, e.g., that of the external power supply level (VDD), by connecting the terminals of the operating voltage signal 'RTO' and the operating voltage signal 'SB'. If the bit line equalization signal 'BLEQ' is deactivated, the power supply unit 543 drives the operating voltage signal 'RTO' to the same voltage level as the external power supply (VDD) and also drives the operating voltage signal 'SB' to the voltage level of the ground voltage source (VSS) as shown in FIG. 7.

In the BLSA 550 of FIG. 6, the cell mat m is not electrically coupled to the cross-coupled latch because both the bit line equalization signal 'BLEQ' and bit line isolation signal 'BIS_M' are deactivated, while the cell mat n is electrically coupled to the cross-coupled latch. Since the column selection signal 'YI' is activated in a state where both the bit line equalization signal 'BLEQ' and the bit line isolation signal 'BIS_M' are deactivated, the BLSA 550 senses and amplifies the data from exterior of the semiconductor integrated circuit 101 through the I/O lines SIO and SIOB and then reads out the data to the cell mat n through the bit line pair BL and BLB. The cell mat n stores the data outputted from the BLSA 550.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:
1. A semiconductor integrated circuit comprising:
a memory cell;
a sense amplifier coupled between a data input terminal and the memory cell; and a sense amplifier controller configured to block a signal path between the sense amplifier and the memory cell and store data from the data input terminal to the sense amplifier when the sense amplifier controller recognizes a test command, wherein the sense amplifier controller includes:
- a bit line equalization signal generating unit configured to generate a bit line equalizing signal to couple a pair of bit lines connected to the sense amplifier by combining a selection signal and a selection blocking signal; and
- a bit line isolation signal generating unit configured to generate a bit line isolation signal to prevent the memory cell from being coupled to the sense amplifier by combining the selection signal and the selection blocking signal.

2. The semiconductor integrated circuit of claim 1, further comprising an array controller configured to inactivate the selection signal to select a row path between a row decoder and the memory cell and to activate the selection blocking signal to block a column path between the sense amplifier and the memory cell when the test command is received.

3. The semiconductor integrated circuit of claim 2, wherein the array controller includes:
- a selection signal generating unit configured to decode array address signals based on a result of combination of an enable signal output in response to an active command and a test mode enable signal output in response to the test command and to output the selection signal; and
- a selection blocking signal generating unit configured to generate the selection blocking signal in response to the test mode enable signal.

4. The semiconductor integrated circuit of claim 3, wherein the selection signal generating unit is further configured to decode the array address signals when the test mode enable signal is deactivated and the enable signal is activated.

5. The semiconductor integrated circuit of claim 3, wherein the selection blocking signal generating unit is further configured to activate the selection blocking signal after a preset time if the test mode enable signal is activated.

6. The semiconductor integrated circuit of claim 3, further comprising a bank controller configured to generate the enable signal and the test mode enable signal using the active command, the test command, and bank address signals.

7. The semiconductor integrated circuit of claim 6, wherein the bank controller includes:
- an enable signal generating unit configured to generate the enable signal using the bank address signals, the test command, and the active command; and
- a test mode enable signal generating unit configured to generate the test mode enable signal using the bank address signals and the test command.

8. The semiconductor integrated circuit of claim 7, wherein the enable signal generating unit is further configured to deactivate the enable signal when the bank address signals are deactivated or when the test command is activated.

9. The semiconductor integrated circuit of claim 7, wherein the test mode enable signal generating unit is further configured to activate the test mode enable signal when the bank address signals and the test command are activated.

10. The semiconductor integrated circuit of claim 1, wherein the bit line equalization signal generating unit is further configured to inactivate the bit line equalizing signal when the selection blocking signal is activated.

11. The semiconductor integrated circuit of claim 1, wherein the bit line isolation signal generating unit is further configured to activate the bit line isolation signal when the selection blocking signal is activated.

* * * * *